United States Patent [19]

Ema et al.

[11] Patent Number: 5,453,397
[45] Date of Patent: Sep. 26, 1995

[54] MANUFACTURE OF SEMICONDUCTOR DEVICE WITH FIELD OXIDE

[75] Inventors: Taiji Ema, Kawasaki; Masaya Katayama, Kasugai, both of Japan

[73] Assignees: Fujitsu Limited, Kawasaki; Fujitsu VLSI Limited, Kasugai, both of Japan

[21] Appl. No.: 304,477

[22] Filed: Sep. 12, 1994

[30] Foreign Application Priority Data

Dec. 14, 1993 [JP] Japan .................................. 5-313849

[51] Int. Cl.⁶ .................................................. H01L 21/76
[52] U.S. Cl. .................................................................. 437/69
[58] Field of Search ............. 437/69, 67; 148/DIG. 117, 148/DIG. 85, DIG. 86

[56] References Cited

U.S. PATENT DOCUMENTS 4,295,266  10/1981  Hsu .
5,151,381   9/1992  Liu et al. .
5,254,494  10/1993  Van der Plas et al. .
5,369,052  11/1994  Kenkare et al. .

OTHER PUBLICATIONS

Pfiester, J., et al, "Nitride Clad LOCOS Isolation for 0.25 Mu CMOS", *1993 Symposium on VLSI Tech.; Digest of Technical Papers*, May 1993, pp. 139–140.

*Primary Examiner*—George Fourson
*Attorney, Agent, or Firm*—Nikaido, Marmelstein, Murray & Oram

[57] ABSTRACT

A method of manufacturing a semiconductor device capable of isolating fine pattern elements by using LOCOS. The method includes the steps of: (a) forming a relatively thick first nitride film pattern on the surface of a semiconductor substrate having an oxide film; (b) wet-etching the oxide film by using the first nitride film as a mask; (c) filling the under-etch region of the first nitride film with nitride and forming a second nitride film thinner than the first nitride film on the exposed surface of the semiconductor substrate; (d) thermally oxidizing all the exposed second nitride film in a dry oxygen atmosphere to form an oxide film on the surface of the semiconductor substrate at least at the region not covered with tile first nitride film; and (e) forming a thermal oxide film on the semiconductor substrate not covered with the first nitride film at a temperature lower than the oxidation temperature at the step (d).

13 Claims, 8 Drawing Sheets

MANUFACTURE OF SEMICONDUCTOR DEVICE WITH FIELD OXIDE

BACKGROUND OF THE INVENTION a) Field of the Invention

The present invention relates generally to a semiconductor device and its manufacturing method, and particularly to a technique of forming a field oxide film for separating fine pattern elements sensitive to junction leakage such as a dynamic RAM.

b) Description of the Related Art

LOCOS (local oxidation of silicon) is widely used as element isolation technique. However, as devices are scaled down and become progressively smaller, a variety of serious problems have occurred. For example, there occur damages to the surface of a silicon substrate when dry-etching an SiN film which is used as an oxidation mask, formation of a so-called bird's beak in an active region because of a field oxide film creeping under an SiN film at its end portion, and other problems.

$Si_3N_4$ film-clad-LOCOS (nitride-clad-LOCOS; NCL) proposed to solve the above problems is a simple and effective method (c.f. 1993 Symposium on VLSI Technology Dig. Tech. Papers, pp.139–140).

FIGS. 6A to 6E illustrate a method of forming a field oxide film by NCL.

As shown in FIG. 6A, a strain absorbing $SiO_2$ film 101 is formed on the surface of a silicon substrate 100 to a thickness of about 15 nm. An SiN film 102 is formed to a thickness of 140 nm to 200 nm on the $SiO_2$ film 101 at the region where a semiconductor device Is to be formed. The SiN film is formed by low pressure CVD or the like and patterned by reactive ion etching (RIE).

As shown in FIG. 6B, by using the SiN film 102 as a mask, the $SiO_2$ film 101 is selectively etched by hydrofluoric acid. At this time, the $SiO_2$ film 101 is under-etched at the end portion of the SiN film 102 so that a hollow 103 is formed. An overhang 102a of the SiN film 102 is formed over the hollow 103.

As shown in FIG. 6C, the surface of the exposed silicon substrate 100 is thermally oxidized to form an $SiO_2$ film 104 to a thickness of about 5.5 nm. At this time, the surface of the SiN film 102 is slightly oxidized so that an $SiO_2$ film is formed thereon.

As shown in FIG. 6D, an SiN film 105 is deposited on the $SiO_2$ film 104 to a thickness of about 10 nm by low pressure CVD. Because the SiN film is grown generally isotropically and conformably on tile exposed surface, the hollow 103 is filled with the SiN film 105. If an n-channel MOSFET is to be formed, impurity ions such as boron are implanted by using the SiN film 102 as a mask to form a channel stop layer 108.

As shown in FIG. 6E, a field oxide film 106 is formed to a thickness of about 500 nm by wet oxidation at a temperature of about 1000° C. During this process, oxidation starts from the surface of the SiN film 105, and after the SiN film 105 on the surface of the silicon substrate 100 has been completely oxidized, the surface of the silicon substrate 100 is oxidized to form the field oxide film 106. The SiN film 105 on the SiN film 102 is also oxidized to form an $SiO_2$ film 107 combined with the $SiO_2$ film 104.

However, the SiN film in the hollow 103 is not oxidized because the SiN film 105 covers the SiN film in the hollow 103 and the oxidation speed of an SiN film is very slow as compared to a silicon oxidation speed. Therefore, an SiN island region 105a is left.

As described above, NCL forms the SiN region 105a just under the end portion of the SiN film 102 which is used as a thermal oxidation mask. Therefore, the oxide film under the SiN region 105a can be made very thin, and oxygen atoms can be prevented from moving under the SiN film 102, thereby suppressing the generation of a bird's beak.

Furthermore, less damages are formed on the surface of the silicon substrate when the SiN film 102 is removed by reactive ion etching (RIE) because a relatively thick $SiO_2$ film 101 is formed under the SiN film 102.

As described above, NCL is a method effective for suppressing generation of a bird's beak of a field oxide film and damages to the surface of a silicon substrate.

However, oxidation of the silicon substrate to form a field oxide film starts only after the thin SiN film 105 on the silicon substrate has been completely oxidized. The oxidation speed of an SiN film is very slow and has a high temperature dependency.

A temperature of at least 1000° C. or higher becomes necessary for the SiN film to be completely oxidized in a practical process time. However, at the temperature of 1000° C. or higher, impurities in the channel stop layer 108 formed at the process illustrated in FIG. 6D diffuse more than desired. Diffusion of impurities along tile surface of the silicon substrate increases the narrow channel effect which narrows the effective width of a MOSFET channel region.

Use of wet oxidation so as to increase an oxidation speed generates ammonium ($NH_3$) by a reaction of nitrogen atoms in the SiN films 102 and 105 with hydrogen atoms in water contents. Ammonium molecules diffuse into the $SiO_2$ films 101 and 104 and reach the surface of tile silicon substrate 100. Nitrogen atoms of ammonium react with the silicon substrate at the surface thereof to form SiN. This SiN formed under the $SiO_2$ film 101 and 104 cannot be removed by the process of etching the SiN films 102 and 105a.

This SiN film Functions as an oxidation shielding mask at the later gate oxide film forming process. A stripe region called a white ribbon not thermally oxidized is left at the region near the border of the field oxide film. This white ribbon causes a lowered breakdown voltage of the gate oxide film, and consequently degrades device performance.

SUMMARY OF THE INVENTION

It is an object of the present invention to provide a LOCOS technology capable of separating fine pattern devices.

It is another object of the present invention to provide a semiconductor device to be formed by a LOCOS technology.

According to one aspect of tile present invention, there is provided a method of manufacturing a semiconductor device including tile steps of: (a) forming a first oxide film on the surface of a semiconductor substrate and Forming a first nitride film on tile surface of the first oxide film, the first nitride film having a predetermined pattern; (b) isotropically etching the first oxide film by using the first nitride film as a mask to partially expose the surface of the semiconductor substrate and form a hollow just under the end portion of the first nitride film; (c) forming a second oxide film thinner than the first oxide film at least on the surface of the semiconductor substrate exposed at the outside of the first nitride film and on the inner surface of the hollow; (d) depositing a nitride film on the semiconductor substrate to form a second nitride film on tile surface of the second oxide film at least at the region excepting the inner surface of the hollow and form a nitride region filling the inside of the hollow; (e) thermally oxidizing the exposed second nitride film in a dry oxygen atmosphere to convert the second nitride film into a third oxide film combined with tile second oxide film; and (f) thermally oxidizing the surface of the semiconductor substrate at the region not covered with tile first nitride film at a temperature lower than the oxidation temperature at the step (e), to form a field oxide film.

A step of implanting first impurity ions through the first nitride film by using a resist film pattern exposing a predetermined region of tile surface of the semiconductor substrate may be included between the steps (d) and (e). The step (e) may include a step of diffusing the first impurity ions into the semiconductor substrate by maintaining the semiconductor substrate at a predetermined temperature for a predetermined time after forming the third oxide film.

A step of etching and removing the third oxide film and a step of forming a fourth oxide film thinner than the third oxide film on tile surface of the exposed semiconductor surface may be included between tile steps (e) and (f).

A step of implanting impurity ions into a predetermined region by using tile first nitride film as a mask after the formation of tile fourth oxide film may be included to form a channel stop layer.

The relatively thick nitride film pattern is formed on the surface of the semiconductor substrate at a predetermined region, and the relatively thin nitride film is formed on the surface of the semiconductor substrate at the other region. The relatively thin nitride film is oxidized at a high temperature, and thereafter the field oxide film is formed at a relatively low temperature by using the relatively thick nitride film as a mask. In this manner, the time during which the semiconductor substrate is exposed to a high temperature can be shortened.

Impurity ions for the channel stop layer may be implanted after the relatively thin nitride film is oxidized at a high temperature. Therefore, the semiconductor substrate is not exposed to a high temperature after the implantation of impurity ions for the channel stop layer. It is therefore possible to suppress the lateral expansion of the channel stop layer along the surface of the semiconductor substrate, preventing a degradation of device performance to be caused by the narrow channel effect.

It is also possible to prevent generation of a white ribbon because of dry oxidation of the relatively thin nitride film.

As described above, fine pattern elements can be separated and isolated without substantially increasing the number of manufacturing processes.

DETAILED DESCRIPTION OF THE PREFERRED EMBODIMENTS

A method of forming a field oxide film according to an embodiment of the invention will be described with reference to FIGS. 1A to 1H.

Figure 1A:
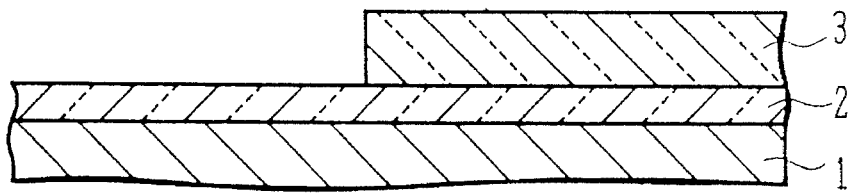
FIGS. 1A to 1H are cross sectional views of a substrate explaining a method of forming a field oxide film according to an embodiment of the invention.

As shown in FIG. 1A, an n-type silicon substrate 1 having a resistivity of about 10 $\Omega$cm is prepared. An oxide film 2 is formed on the surface of the silicon substrate 1 to a thickness of about 20 nm by thermal oxidation. Next, an SiN film 3 is deposited to a thickness of about 150 nm by CVD and patterned by conventional photolithography and reactive ion etching (RIE).

Although the stoichiometry composition of silicon nitride is $Si_3Ni_4$, silicon nitride to be used by the embodiment is not limited thereto, but various compositions may be used and it is generally represented by SiN.

The $SiO_2$ film 2 under the nitride film 3 is relatively thick having a film thickness of about 20 nm. Therefore, no damage is formed on the surface of the silicon substrate 1 when the SiN film 3 is etched by RIE.

A conventional method used before the advent of NCL requires to make an $SiO_2$ film 2 under the SiN film 3 as thin as 5 nm or less in order to prevent generation of a bird's beak. Therefore, when the SiN film 3 is etched by RIE, the $SiO_2$ film 2 is also etched and the surface of the silicon substrate 1 is partially exposed. It is therefore difficult to avoid damages to the surface of the silicon substrate 1 by RIE.

In this embodiment, the $SiO_2$ film 2 is not required to have the upper limit thickness necessary for satisfying the conditions of preventing generation of a bird's beak. As described above, with a sufficient thickness of the $SiO_2$ film 2, it becomes possible to avoid damages to the surface of the silicon substrate 1. In order to reliably leave the $SiO_2$ film 2 on the surface of the silicon substrate 1 when the SiN film 3 is etched, it is preferable that the $SiO_2$ film 2 has a thickness of 15 to 20 nm or more.

Figure 1B:
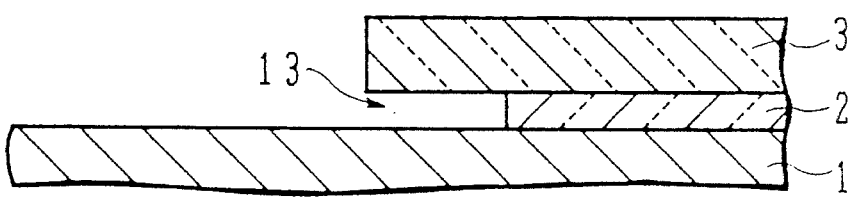

As shown in FIG. 1B, the silicon substrate 1 is immersed into diluted hydrofluoric acid aqueous solution of $H_2O$:HF= 10:1 for two minutes to selectively etch the $SiO_2$ film 2. The surface of the silicon substrate 1 is therefore exposed at the region not covered with the SiN film 3. The $SiO_2$ film 2 is also etched in the lateral direction under the end portion of the SiN film 3 to form a hollow 13 under the SiN film 3. Under the above conditions, a depth of tile hollow 13 is about 100 nm.

Figure 1C:
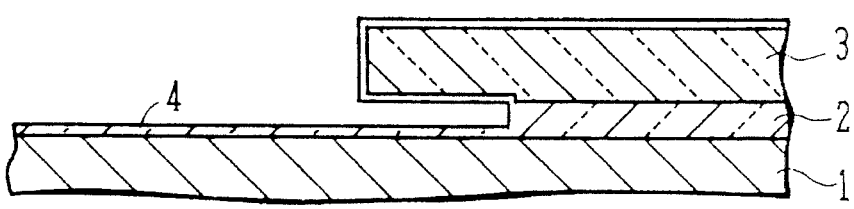

As shown in FIG. 1C, tile silicon substrate is thermally oxidized at a temperature of 850° C. to form an $SiO_2$ film 4 on the exposed surface of the silicon substrate 1 to a thickness of 5 nm. It is preferable to set a thickness of the $SiO_2$ film 4 to be about 5 nm or less in order to prevent a bird's beak. The $SiO_2$ film 4 is also formed on tile surface of the silicon substrate under the hollow 13. The height of the inner space of the hollow 13 at tills time is about 15 nm. An $SiO_2$ film is also formed slightly on tile surface of the SiN film 3.

Figure 1D:
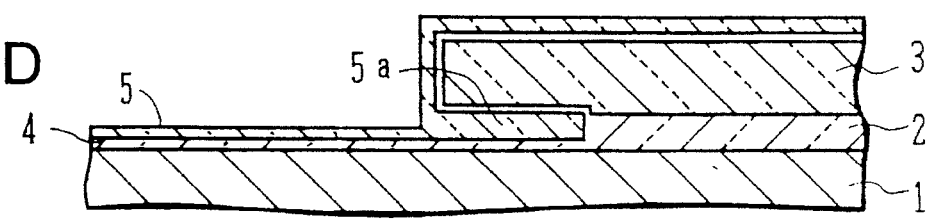

As shown in FIG. 1D, an SiN film is deposited on the silicon substrate surface to a thickness of about 10 nm by CVD. The thickness of the SiN film is set slightly greater than a half of tile height of the inner space of the hollow 13 which is about 15 nm. At tile inside of the hollow 13, the SiN film grows isotropically on tile upper and lower walls of the hollow 13 and completely fills the inside with SiN to form an SiN region 5a. The SiN film 5 is formed on the upper surface and side wall of the SiN film 3 and on tile surface of tile silicon substrate 1 at the region not covered with the SiN film 3. The SiN region 5a has a configuration covered with the SiN film 5.

A thickness of tile SiN film 5 is preferably set to 20 nm or less when taking into consideration an oxidation time at process of oxidizing the SiN film 5 to be later described with FIG. 1F. Therefore, tile thickness of the SiN region 5a is 40 nm or less. It is therefore preferable that the thickness of the SiO$_2$ film 2 is about 15 to 40 nm, and more preferably about 20 to 40 nm.

Figure 1E:
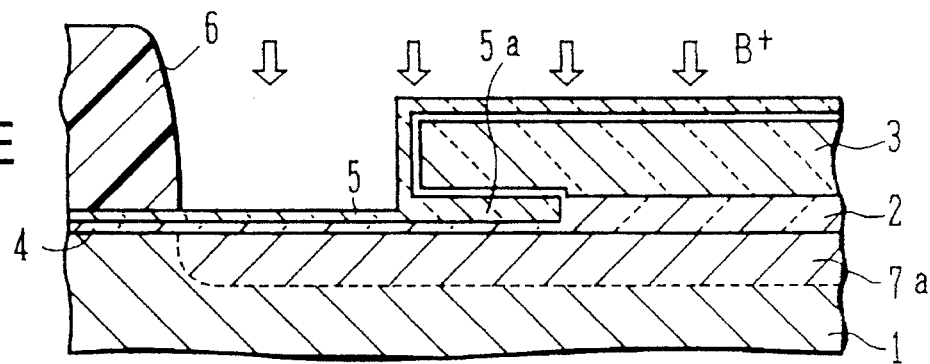

As shown in FIG. 1E, a pattern of a resist film 6 is formed exposing an p-type well forming teflon. Next, a boron implanted region 7a is formed by implanting boron ions at a dose of $1\times10^{13}$cm$^{-2}$ and at an energy allowing ions to pass through the SiN film 3, for example, at 150 keV. In this embodiment, a p-type well is formed in tile n-type substrate. All the conductivity types may be inverted. Twin wells, triple wells, or the like may be formed if desired.

Figure 1F:
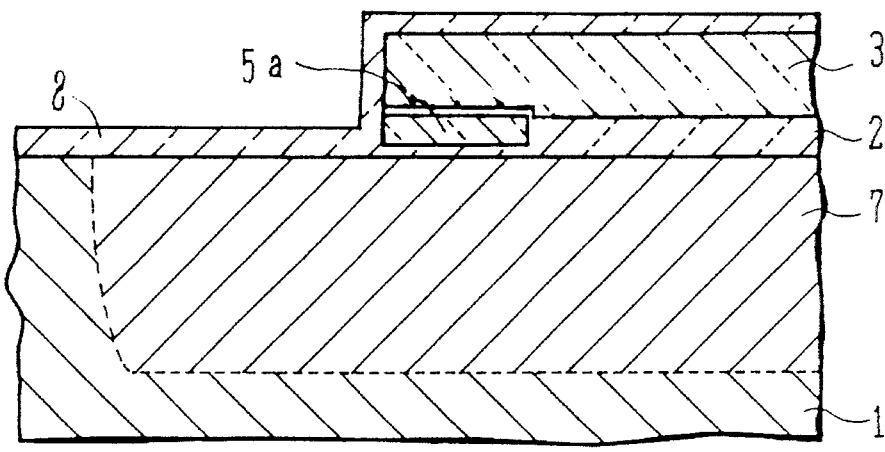

As shown in FIG. 1F, tile resist mask 6 is removed by ashing it in an oxygen plasma, and thereafter, surface oxidation and boron diffusion are performed. First, the substrate is placed in a high temperature diffusion furnace to heat it to a temperature of 1200° C. Dry oxygen is introduced into the diffusion furnace for the first 30 minutes, and then dry nitrogen is introduced for 150 minutes.

In the first 30 minutes, the surface SiN film 5 is completely oxidized and converted into an oxide film which is combined with the SiO$_2$ film 4 under the SiN film 5 to thereby form an SiO$_2$ film 8. It is preferable to use a high temperature of about 1100° C. or higher in order to oxidize the nitride film. The total thickness of the SiO$_2$ film oxidized from the SiN film 5 and the original SiO$_2$ film 4, i.e., the thickness of the SiO$_2$ film 8, is about 20 nm. The SiO$_2$ film 8 having a thickness greater than 20 nm may be Formed in some case when the surface of the silicon substrate 1 is oxidized.

The SiN region 5a filled in the hollow 13 is scarcely oxidized because the oxidation speed of SiN is very slow.

While the silicon substrate 1 is exposed to a high temperature for the total time of 180 minutes, boron ions implanted at the step illustrated in FIG. 1E are diffused to form a p-type well 7.

As described above, the thin SiN film on the substrate surface can be oxidized in an oxidizing atmosphere for the first predetermined time at the boron diffusion process for a p-type well.

Figure 1G:
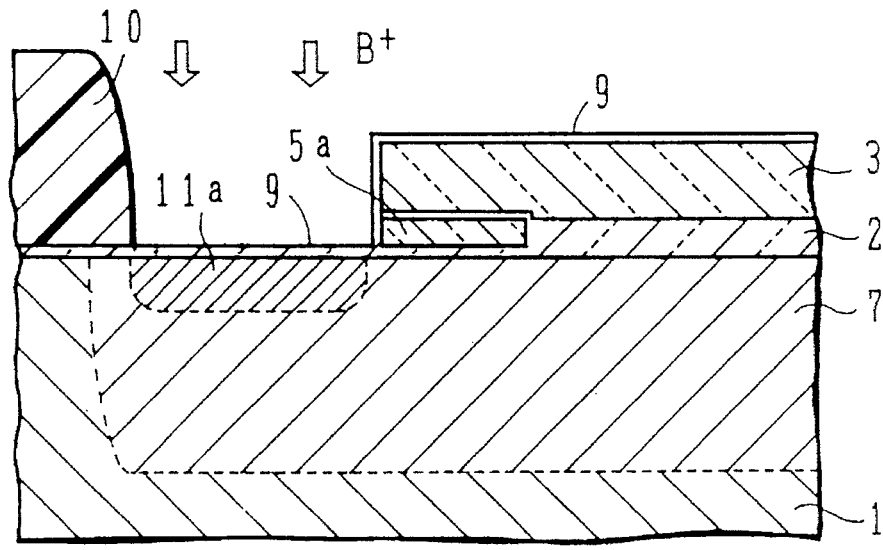

As shown in FIG. 1G, boron ions are implanted to form a channel stop layer. First, the SiO$_2$ film 8 formed at the preceding process is etched and removed in hydrofluoric acid solution. Next, a thermal oxide film 9 is formed to a thickness of 10 nm on the exposed surface of the silicon substrate 1. The SiO$_2$ film 8 is removed and a new oxide film 9 is formed. The reason for this is that it is necessary to implant boron ions at a good selectivity and precisely control the thickness of the SiO$_2$ film 9 over the ion implanting region.

Then, a pattern of a resist mask 10 is formed exposing the region where a channel stop layer is formed. By using the resist film 10 and the SiN film 3 as a mask, boron ions are implanted at a dose of $5\times10^{13}$cm$^{-2}$ and at an energy of 18 keV so as to form a boron implanted region 11a.

Figure 1H:
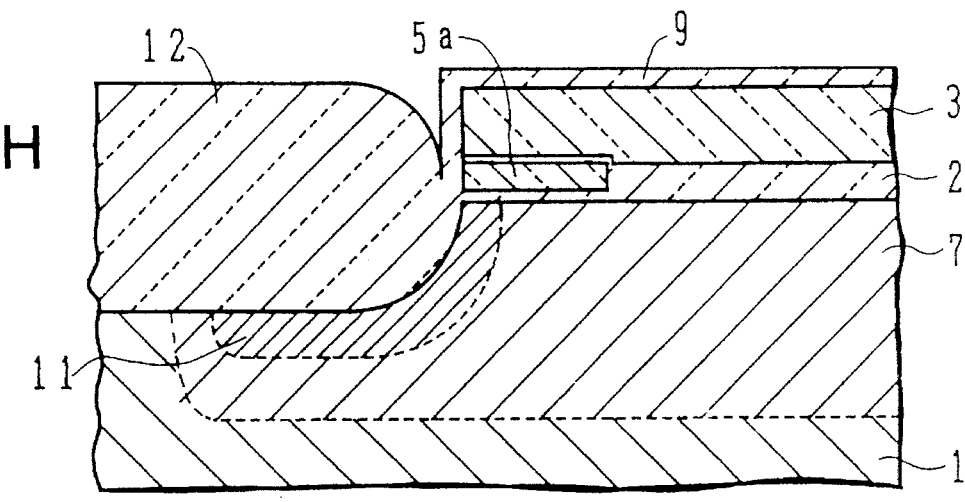

As shown in FIG. 1H, the resist film 10 is ashed and removed in oxygen plasma, and the silicon substrate 1 is wet-oxidized at a temperature of about 900° C. to form a field oxide film 12 to a thickness of 350 nm. This oxidation temperature is preferably lower than 950° C., and more preferably about 900° C. or lower. The field oxide film having a desired thickness can be formed at a relatively low temperature because no SiN film is formed at the silicon substrate surface at the region where the field oxide film is formed. During this process, boron ions in the boron implanted region 11a diffuse to form a channel stop layer 11. The diffusion distance of impurities in the channel stop layer 11 is short because the Field oxide film 12 is formed at a relatively low temperature.

The SiN film 3 is also slightly oxidized so that the SiO$_2$ film 9 on the surface of the SiN film 3 becomes thick. However, this thickened SiO$_2$ film 9 poses no problem at the later processes.

Lastly, the SiN film 3 and associated films are removed, and a gate insulating film, a gate electrode, a source region, a drain region, and other necessary elements are formed to complete a MOSFET.

Figure 2:
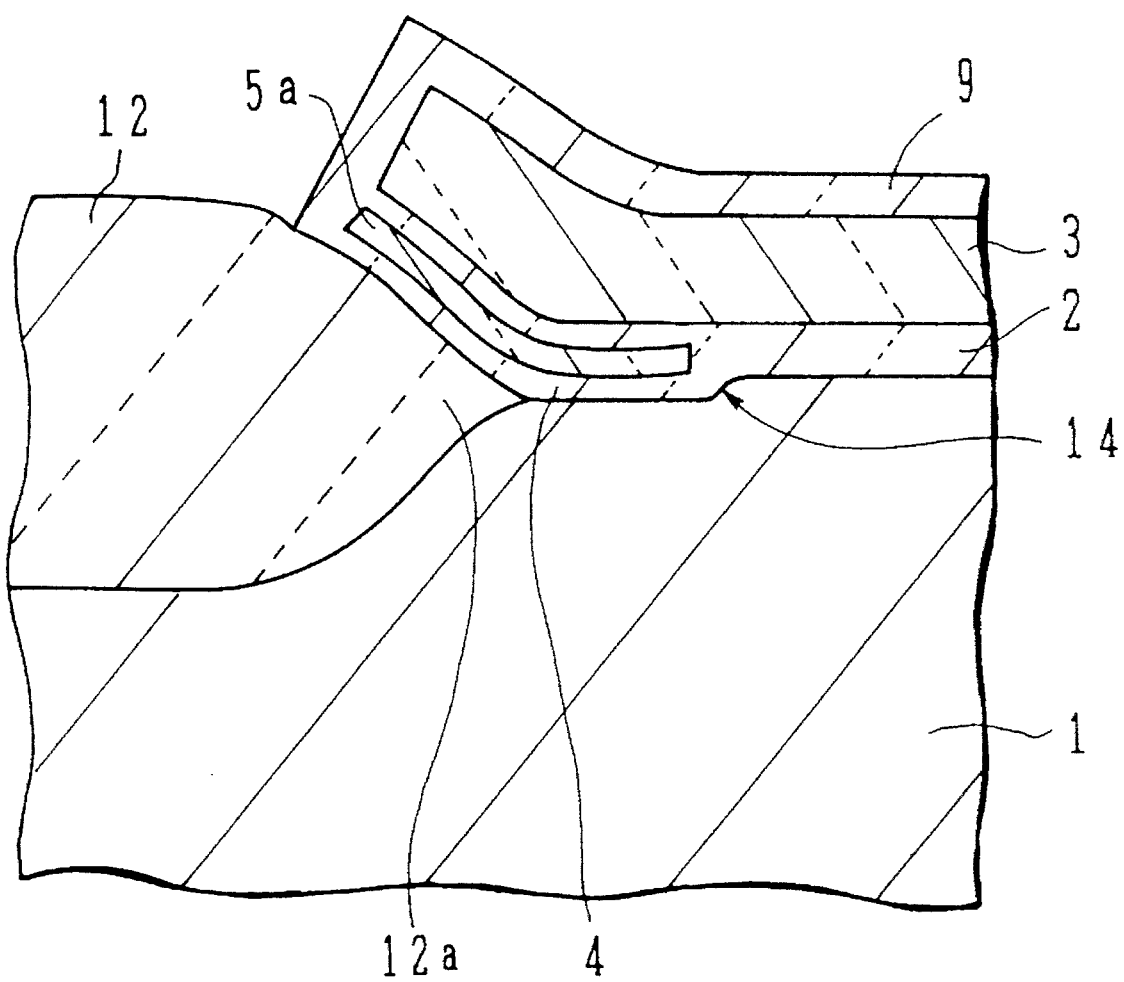
FIG. 2 is an enlarged cross sectional view showing the end portion of a field oxide film according to an embodiment of the invention.

FIG. 2 is an enlarged cross sectional view exaggeratedly showing the features of the region near the end portion of the field oxide film 12. The surface of the silicon substrate 1 under the SiN region 5a is again thermally oxidized as illustrated in FIG. 1C after the SiO$_2$ film 2 is removed, to form the SiO$_2$ film 4 to a thickness of 5 nm. The silicon thermal oxide film is formed, with more than a half of its thickness being embedded in silicon. As a result, the boarder between the region of the SiO$_2$ film 2 unetched by the etching process illustrated in FIG. 1B and the region where the SiO$_2$ film is removed and the SiO$_2$ film 4 is formed, has a step 14 of at least several crystal lattices on the surface of the silicon substrate 1. Even if the SiO$_2$ film 4 is made thinner, a step of at least several atomic layers is formed.

As a result, after the SiN film 8, SiO$_2$ film 2, and the like are removed For the formation of a gate insulating film, the surface of the silicon substrate 1 has the step 14 near at the border of the field oxide film 12. This step does not adversely affect the device performance.

Since the field oxide film is formed at a relatively low temperature of about 900° C., the field oxide film is not softened at the thermal oxidation process. Therefore, the field oxide film under the end portion of the SiN film 3 pushes up the SiN film 3, forming a small bird's beak 12a. However, the SiN region 5a is left at the end portion of the SiN film 3 and the SiO$_2$ film just under the SiN region 5a is very thin. Therefore, this small bird's beak poses no practical problem in manufacturing a semiconductor device.

Figure 3A:
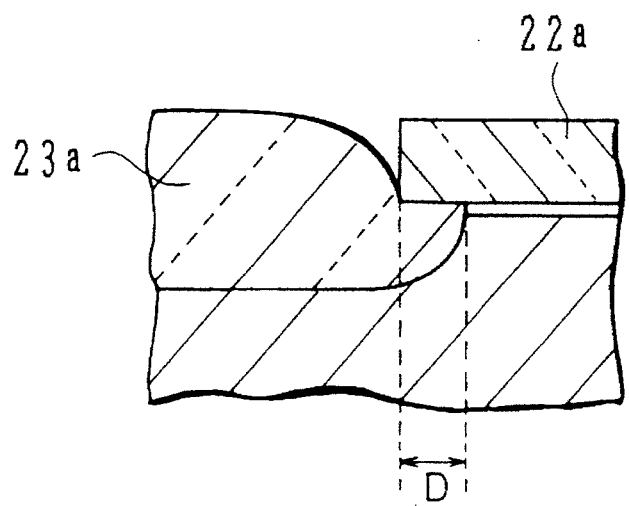
FIGS. 3A to 3D are cross sectional views and plan views, showing the end portions of field oxide films formed at temperatures higher than and lower than the softening point of $SiO_2$.
Figure 3B:
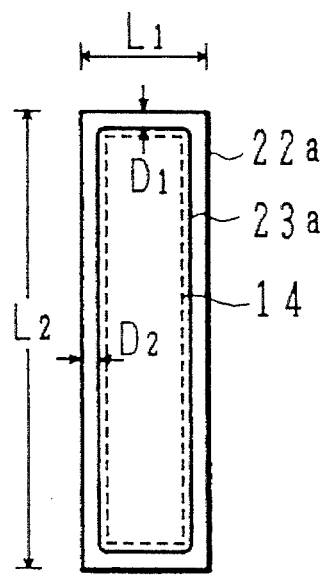
Figure 3C:
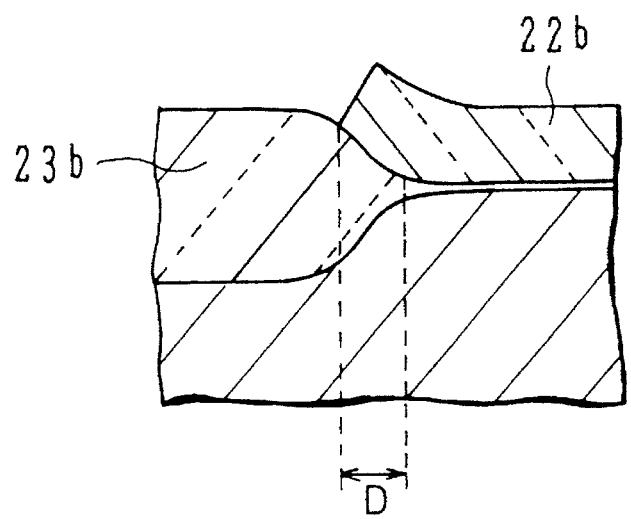
Figure 3D:
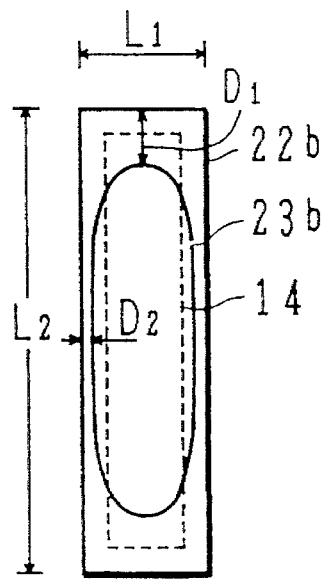

FIGS. 3A to 3D show the shapes of the end portions of field oxide films formed at about 1000° C. or higher and at about 900° C. or lower. The softening point of a silicon oxide film is about 950° C. FIGS. 3A and 3B show the shape of the end portion of a field oxide film formed at 1000° C. or higher, and FIGS. 3C and 3D show the shape of the end portion of a field oxide film formed at 900° C. or lower. FIGS. 3A and 3C are cross sectional views showing the end portions of the field oxide films, and FIGS. 3B and 3D are plan views of the end portions of the field oxide films.

As shown in FIG. 3A, the $SiO_2$ film 23a formed at 1000° C. or higher which is higher than the softening point creeps under the end portion of the SiN film 22a without pushing up the SiN film 22a.

Therefore, as shown in FIG. 3B, the creeping lengths of the field oxide film 23a have a relatively small difference between the longer side and shorter side of a rectangular pattern of the SiN film 22a. For example, in the case of a field oxide film having a shorter side length L1 of 1 μm, a longer side length L2 of 5 μm, and a film thickness of about 350 nm, the creeping length D1 at the shorter side was about 0.2 μm and the creeping length D2 at the longer side was about 0.07 to 0.1 μm.

The step shown in FIG. 2 is formed at the position about 0.1 μm inside of the end of the SiN film 22a. Therefore, the end of the field oxide film 23a is generally the same position as the step 14 or is at the outside of the step 14.

As shown in FIG. 3C, the $SiO_2$ film 23b formed at 900° C. or lower which is lower than the softening point creeps under the end portion of the SiN film 22b and pushes up the SiN film 22b.

Therefore, as shown in FIG. 3D, the creeping length D1 of the field oxide film 23b at the shorter side of the rectangular pattern of the SiN film 22b becomes longer than the creeping length D2 at the longer side. For example, in the case of a field oxide film having a shorter side length L1 of 1 μm, a longer side length L2 of 5 μm, and a film thickness of about 350 nm, the creeping length D1 at the shorter side was about 0.5 μm and the creeping length D2 at the longer side was about 0.05 μm.

In this case, therefore, the end of the field oxide film 23b is at the outside of the step 14 at the longer side and at the inside of the step 14 at the shorter side.

The creeping length changes with a length of each side of a rectangle, a thickness of a field oxide film, and the like. In the case of a rectangular pattern of an SiN film having a shorter side length of about 1 μm and a longer side length of about 5 μm, the creeping length at the shorter side is about five times that at the longer side, or more.

After the SiN film is removed after the field oxide film forming process, a mark of the SiN film is left on the surface of the silicon substrate. A temperature of the field oxidation can be known by measuring distances between the mark to the ends of the field oxide film and calculating a ratio between the creeping lengths at the shorter and longer sides.

Next, an application of the field oxide film forming method of the embodiment to a DRAM will be described.

Figure 4:
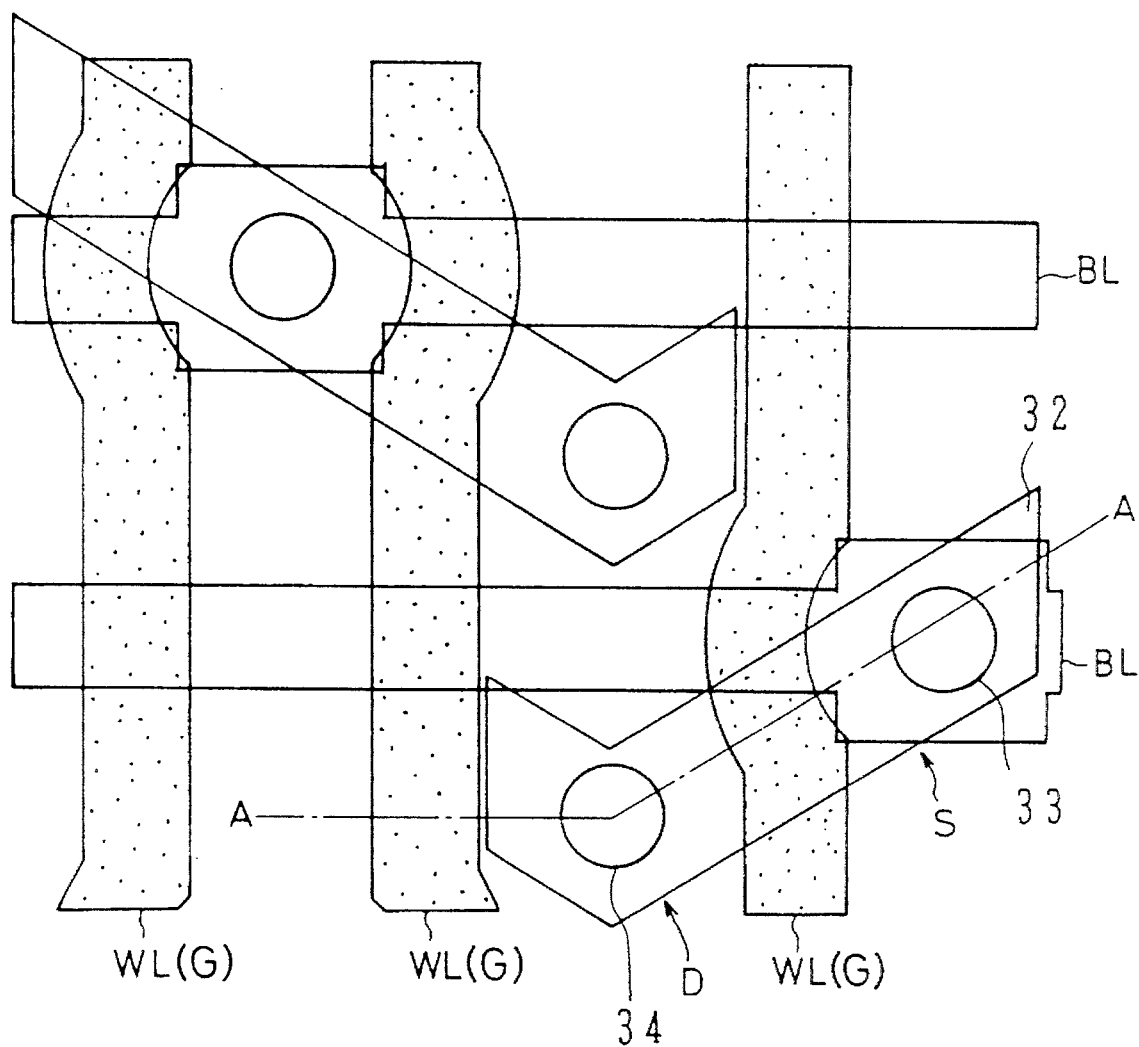
FIG. 4 is a plan view of a DRAM formed by employing the field oxide film forming method according to the embodiment of the invention.
Figure 5:
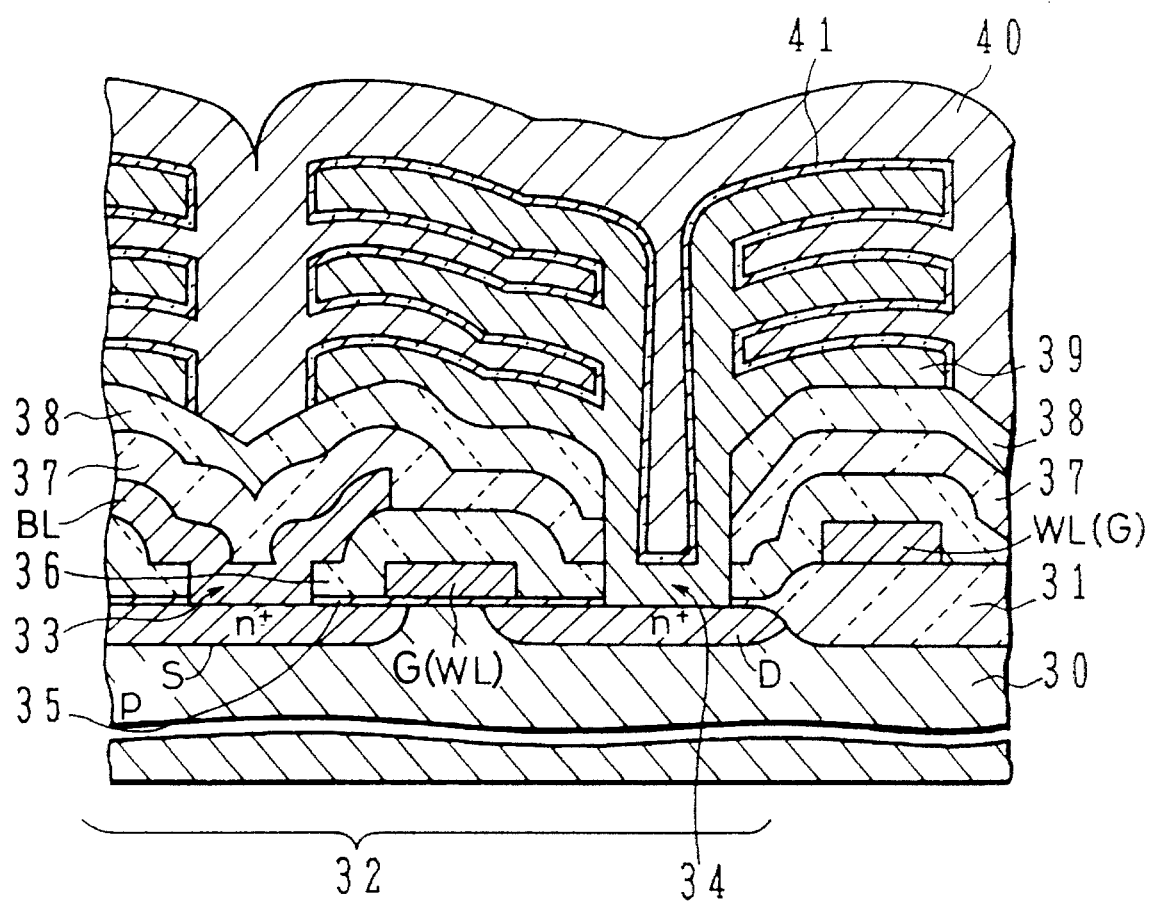
FIG. 5 is a cross sectional view of a DRAM formed by employing the field oxide film forming method according to the embodiment of the invention.
Figure 6A:
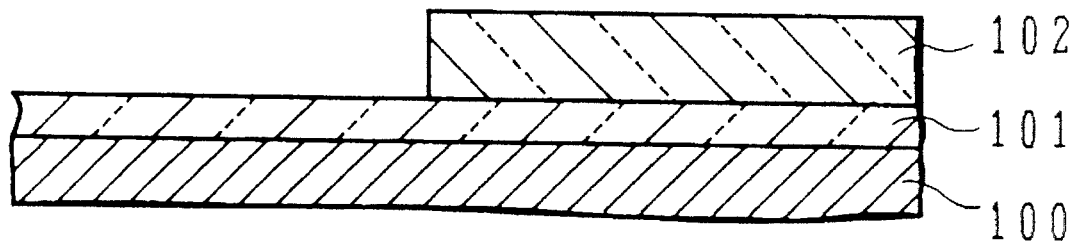
FIGS. 6A to 6E are cross sectional views of a semiconductor substrate explaining a conventional method of forming a field oxide film.
Figure 6B:
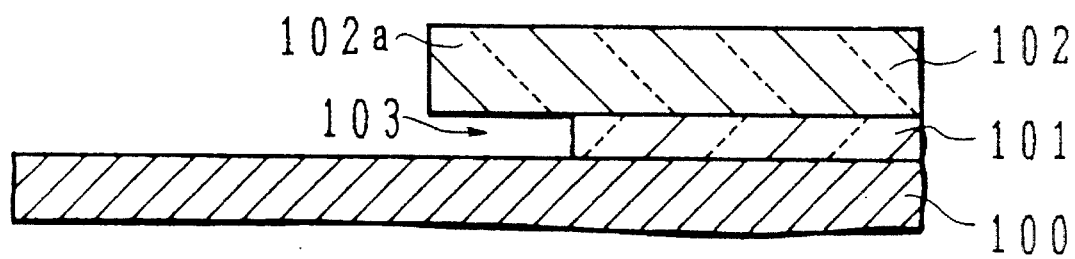
Figure 6C:
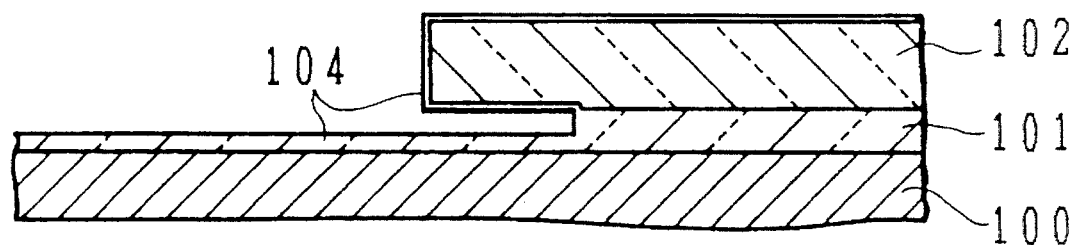
Figure 6D:
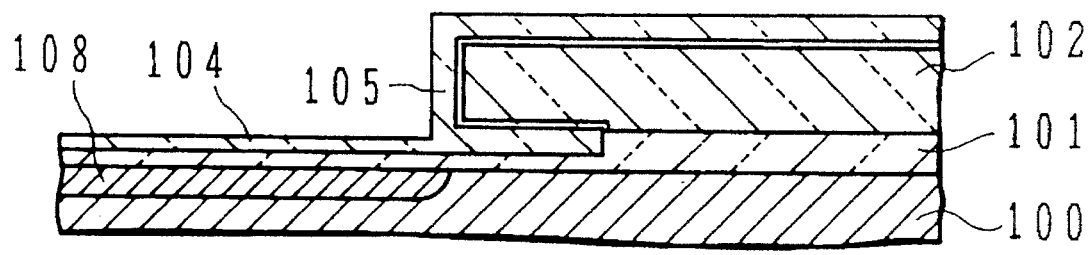
Figure 6E:
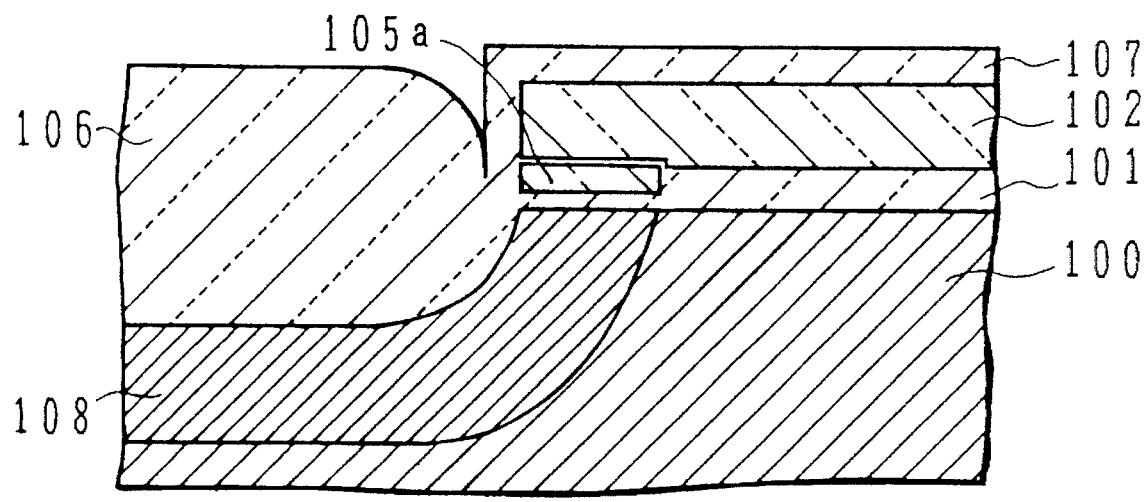

FIG. 4 is a plan view of a DRAM, and FIG. 5 is a cross sectional view taken along chain line A—A.

As shown in FIG. 5, a field oxide film 31 is formed on the surface of a p-type silicon substrate 30 by the embodiment method described earlier, and an active region 32 is defined by the filed oxide film 31. Formed in the active region 32 are an n-channel MOS transistor having an $n^+$-type source region S, an $n^+$-type drain region D, a gate insulating film 35, and a gate electrode G on the gate insulating film 35.

As shown in FIG. 4, the gate electrode is integrally formed with a word line WL extending in the up/down direction as viewed in FIG. 4. As shown in FIG. 5, the source region S is connected to a bit line BL extending in the front/back direction as viewed in FIG. 5 (right/left direction in FIG. 4) via a bit line contact hole 33 Formed in an insulation film 36 covering the word line WL and the gate insulating film 35.

Insulation films 37 and 38 are laminated on the bit line BL and insulation film 36. The drain region D is connected to a polycrystalline silicon storage electrode 39 via a storage contact hole 34 formed in the gate insulating film 35 and insulation films 36, 37, and 38. The storage electrode 39 is constituted by a cylindrical shaft extending upward from the storage contact hole 34 and three stacked vanes or fins projecting from the shaft on planes in parallel with the substrate surface.

A dielectric film 41 such as $SiO_2$ is formed covering the storage electrode 39, and a cell plate 40 of polycrystalline silicon is formed covering the surface of the dielectric film 41.

With the storage electrode 39 having the structure described above, the interface between the storage electrode 39 and cell plate 40 is allowed to have a large area. Therefore, an electrostatic capacitance between the storage electrode 39 (drain region D) and cell plate 40 can be made large.

As shown in FIG. 4, bit lines BL and word lines WL are intersecting at a right angle to form a lattice shape. One end of the active region 32 is positioned under the bit line, and the other end is positioned passing the word line WL. In each segment of the lattice structure formed by BLs and WLs, one end of the active region 32 is positioned under BL and the other end is positioned in a space of an adjacent segment on a diagonal line. Namely, the active region 32 is shaped to have a parallelogram having a pair of sides oblique to both the bit lines BL and word lines WL.

A combination of two types of parallelograms shown in FIG. 4 may be used. The shape of an active region surrounded by a field oxide film is not limited to a parallelogram, but any other shapes such as a rectangle, a combination of a rectangle and a parallelogram may be used.

In FIGS. 4 and 5, a DRAM has been used as an example of an application of the field oxide film forming method of the embodiment illustrated in FIGS. 1A to 1H. The embodiment method may be used to other semiconductor devices, such as SRAMs and logic ICs.

The present invention has been described in connection with the preferred embodiments. The invention is not limited only to the above embodiments. It is apparent to those skilled in the art that various modifications, improvements, combinations and the like can be made without departing from the scope of the appended claims.

We claim:

1. A method of manufacturing a semiconductor device comprising the steps of:

(a) forming a first oxide film on the surface of a semiconductor substrate and forming a first patterned nitride film on the surface of said first oxide film;

(b) isotropically etching said first oxide film by using said first nitride film as a mask to partially expose the surface of said semiconductor substrate and form a hollow just under the end portion of said first nitride film;

(c) forming a second oxide film thinner than said first oxide film at least on the exposed surface of said semiconductor substrate and on the inner surface of said hollow;

(d) depositing a nitride film on said semiconductor substrate to form a second nitride film on the surface of said second oxide film at least at the region excepting the inner surface of said hollow and form a nitride region filling the inside of said hollow;

(e) thermally oxidizing said second nitride film outside the hollow in a dry atmosphere to convert said second nitride film outside the hollow into a third oxide film combined with said second oxide film; and (f) thermally oxidizing the surface of said semiconductor substrate at the region not covered with the resultant remaining portion of said first nitride film at a temperature lower than the oxidation temperature at the step (e), to form a field oxide film.

2. A method according to claim 1, wherein said first oxide film has a thickness of about 15 to 40 nm.

3. A method according to claim 1, wherein the oxidation temperature at the step (f) is lower than 950° C.

4. A method according to claim 3, wherein the oxidation temperature at the step (f) is about 900° C.

5. A method according to claim 1, wherein the oxidation temperature at the step (e) is at least about 1200° C.

6. A method according to claim 1, further comprising a step of implanting first impurity ions through said first nitride film by using a resist film pattern having an opening over a region of the surface of said semiconductor substrate, between the steps (d) and (e).

7. A method according to claim 6, wherein the step (e) includes a step of diffusing said first impurity ions into said semiconductor substrate by maintaining said semiconductor substrate at a sufficient temperature for a sufficient time after forming said third oxide film.

8. A method according to claim 1, further comprising a step of etching and removing said third oxide film and a step of forming a fourth oxide film thinner than said third oxide film on the surface of said exposed semiconductor surface, between the steps (e) and (f).

9. A method according to claim 8, further comprising a step of implanting impurity ions into a predetermined region by using said first nitride film as a mask after the formation of said fourth oxide film, to form a channel stop layer.

10. A method according to claim 1, wherein said second oxide film has a thickness of about 5 nm or less.

11. A method according to claim 10, wherein said first oxide film has a thickness of about 20 to 40 nm.

12. A method according to claim 10, wherein the oxidation temperature at the step (e) is about 1200° C. or higher.

13. A method according to claim 12, wherein the oxidation temperature at the step (f) is about 900° C. or lower.

* * * * *